US010236912B2

(12) United States Patent
Park et al.

(10) Patent No.: US 10,236,912 B2
(45) Date of Patent: Mar. 19, 2019

(54) LOW DENSITY PARITY CHECK CODE FOR TERRESTRIAL CLOUD BROADCAST

(71) Applicant: Electronics and Telecommunications Research Institute, Daejeon (KR)

(72) Inventors: Sung Ik Park, Daejeon-si (KR); Heung Mook Kim, Daejeon-si (KR); Nam Ho Hur, Daejeon-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 15/796,177

(22) Filed: Oct. 27, 2017

(65) Prior Publication Data

US 2018/0048330 A1    Feb. 15, 2018

Related U.S. Application Data

(63) Continuation of application No. 15/351,660, filed on Nov. 15, 2016, now Pat. No. 9,831,896, which is a
(Continued)

(30) Foreign Application Priority Data

Jun. 1, 2012   (KR) .................. 10-2012-0059089
May 16, 2013   (KR) .................. 10-2013-0055762

(51) Int. Cl.
  *H03M 13/11*   (2006.01)
  *H03M 13/00*   (2006.01)
  *H04L 1/00*    (2006.01)

(52) U.S. Cl.
  CPC .... *H03M 13/1185* (2013.01); *H03M 13/1105* (2013.01); *H03M 13/116* (2013.01);
(Continued)

(58) Field of Classification Search
  CPC ........... H03M 13/116; H03M 13/1185; H03M 13/1102; H03M 13/1165; H03M 13/1168;
(Continued)

(56) References Cited

U.S. PATENT DOCUMENTS 7,516,391 B2   4/2009   Kyung et al.
7,752,520 B2   7/2010   Kia
(Continued)

FOREIGN PATENT DOCUMENTS

CN   101036301 A   9/2007
CN   102904583 A   1/2013
(Continued)

OTHER PUBLICATIONS

Choi et al., Rate compatible puncturing for low density parity check codes with dual diagonal parity structure, 2005, IEEE 16th International Symposium on personal, indoor and mobile radio communications, pp. 2642-2646.
(Continued)

*Primary Examiner* — Shelly A Chase
(74) *Attorney, Agent, or Firm* — William Park & Associates Ltd.

(57) ABSTRACT

Provided is an LDPC (Low Density Parity Check) code for terrestrial cloud broadcast. A method of encoding input information based on an LDPC (Low Density Parity Check) includes receiving information and encoding the input information with an LDPC codeword using a parity check matrix, wherein the parity check matrix may have a structure obtained by combining a first parity check matrix for an LDPC code having a higher code rate than a reference value with a second parity check matrix for an LDPC code having a lower code rate than the reference value.

6 Claims, 12 Drawing Sheets

Related U.S. Application Data continuation of application No. 14/942,392, filed on Nov. 16, 2015, now Pat. No. 9,621,190, which is a continuation of application No. 13/906,843, filed on May 31, 2013, now Pat. No. 9,225,358.

(52) U.S. Cl.
CPC .... *H03M 13/1165* (2013.01); *H03M 13/1168* (2013.01); *H03M 13/616* (2013.01); *H03M 13/6552* (2013.01); *H03M 13/6555* (2013.01); *H04L 1/0041* (2013.01); *H04L 1/0058* (2013.01)

(58) Field of Classification Search
CPC ........... H03M 13/6516; H03M 13/616; H03M 13/1105; H03M 13/6552; H03M 13/6555
See application file for complete search history.

(56) References Cited

U.S. PATENT DOCUMENTS

| | | | |
|---|---|---|---|
| 7,802,171 | B2 | 9/2010 | Li et al. |
| 7,802,172 | B2 | 9/2010 | Casado et al. |
| 7,984,364 | B2 | 7/2011 | Park et al. |
| 8,060,805 | B2 | 11/2011 | Kyung et al. |
| 8,407,555 | B2 * | 3/2013 | Shen .................. H03M 13/033 714/752 |
| 8,578,249 | B2 | 11/2013 | Khandekar et al. |
| 2007/0011569 | A1 | 1/2007 | Vila Casado et al. |
| 2007/0033480 | A1 | 2/2007 | Lee et al. |
| 2007/0033497 | A1 | 2/2007 | Shen et al. |
| 2008/0059862 | A1 | 3/2008 | Kyung et al. |
| 2008/0294963 | A1 | 11/2008 | Hwang |
| 2011/0083052 | A1 | 4/2011 | Lau et al. |
| 2012/0257643 | A1 | 10/2012 | Wu et al. |

FOREIGN PATENT DOCUMENTS

| | | |
|---|---|---|
| EP | 2568612 A1 | 3/2013 |
| KR | 1020060016059 A | 2/2006 |
| KR | 1020060124509 A | 12/2006 |
| KR | 1020080102902 A | 11/2008 |
| KR | 100975558 B1 | 8/2010 |
| WO | 2008007927 A3 | 1/2008 |

OTHER PUBLICATIONS

Jiang et al., Construction of multiple rate quasi-cyclic LDPC codes via the hyperplane decomposing, Jun. 2011, IEEE Journal of Comm. & networks, vol. 12, No. 3, pp. 205-210.

Marc P. C. Fossorier, Quasi-Cyclic low density parity check codes from circulant permutation matrices, Aug. 2004, IEEE trans. on Information Theory, vol. 50, No. 8, pp. 1788-1793.

Mohammadreza Yazdani and Amir H. Banihashemi, "On construction of rate-compatible low-density Parity-check codes," Communications, 2004 IEEE International Conference on, Jun. 24, 2004, pp. 430-434.

Noah Jacobsen and Robert Soni, "Design of Rate-Compatible Irregular LDPC Codes Based on Edge Growth and Panty Splitting," Vehicular Technology Conference, 2007. VTC-2007 Fall. 2007 IEEE 66th, Oct. 3, 2007.

Song et al., Burst decoding of cyclic codes based on Circulant parity check matrices, Mar. 2010, IEEE Trans. on Information Theory, vol. 56, No. 3, pp. 1038-1047.

Yang et al, Design of efficiently encodable moderate-length high rate irregular LDPC codes, Apr. 2004, IEEE Trans. on omm., vol. 52, No. 4, pp. 564-571.

* cited by examiner

LOW DENSITY PARITY CHECK CODE FOR TERRESTRIAL CLOUD BROADCAST

CROSS-REFERENCE TO RELATED APPLICATION

This application is a continuation application of U.S. application Ser. No. 15/351,660 filed Nov. 15, 2016, which is a continuation application of U.S. application Ser. No. 14/942,392 filed on Nov. 16, 2015, which is a continuation application of U.S. application Ser. No. 13/906,843 filed on May 31, 2013, and claims priority to Korean Patent Applications No. 10-2012-0059089 filed on Jun. 1, 2012, and No. 10-2013-0055762 filed on May 16, 2013, the contents of which are herein incorporated by reference in its entirety.

The text file "PA1264-3C_Table.txt", created on Oct. 27, 2017, is incorporated herein by reference in its entirety as though fully set forth herein. The size of the text file "PA1264-3C_Table.txt" is 137 KB.

TECHNICAL FIELD

Embodiments of the present invention are directed to LDPC (Low Density Parity Check) codes for terrestrial cloud broadcast signals to correct errors that occur on a radio channel in a terrestrial cloud broadcast system that operates in a single frequency network.

DISCUSSION OF THE RELATED ART

The current terrestrial TV broadcasting causes co-channel interference that amounts to three times the service coverage and thus cannot reuse the same frequency in an area that is within three times the service coverage. As such, the area where frequency cannot be reused is referred to as white space. Occurrence of a white space sharply deteriorates spectrum efficiency. This situation led to the need of a transmission technology that facilitates reuse of frequency and removal of white space, which focus upon robustness in reception, as well as an increase in transmission capacity, so as to enhance spectrum efficiency.

A terrestrial cloud broadcast technology that provides for easy reuse, prevents white space from occurring, and allows a single frequency network to be readily set up and operated has been recently suggested in the document entitled "Cloud Transmission: A New Spectrum-Reuse Friendly Digital Terrestrial Broadcasting Transmission System", published IEEE Transactions on Broadcasting, vol. 58, no. 3 on IEEE Transactions on Broadcasting, vol. 58, no. 3.

A use of such terrestrial cloud broadcast technology enables a broadcaster to transmit broadcast content that is the same nationwide or different per local area through a single broadcast channel. To achieve such goal, however, the receiver should be able to receive one or more terrestrial cloud broadcast signals in an area where signals transmitted from different transmitters overlap, i.e., overlapping area, and should be able to distinguish the received terrestrial cloud broadcast signals from each other and demodulate the distinguished signals.

In other words, under the situation where there is the same channel interference and timing and frequency sync is not guaranteed for each transmitted signal, one or more cloud broadcast signals should be demodulated.

For this, the terrestrial cloud broadcast system needs to operate in an environment where noise power is larger than the power of the broadcast signal, i.e., a negative SNR (Signal to Noise Ratio) environment. Accordingly, a need exists for an error correction code that operates even in such a negative SNR environment for terrestrial cloud broadcast.

SUMMARY

An object of the present invention is to provide an LDPC encoder and LDPC encoding method for encoding input information based on an LDPC (Low Density Parity Check).

Another object of the present invention is to provide an LDPC (Low Density Parity Check) code that operates even in a negative SNR (Signal to Noise Ratio) environment for terrestrial cloud broadcast.

Still another object of the present invention is to provide an LDPC code having better performance and lower complexity than the existing LDPC code.

According to an aspect of the present invention, a method of encoding input information based on an LDPC (Low Density Parity Check) includes receiving information and encoding the input information with an LDPC codeword using a parity check matrix, wherein the parity check matrix may have a structure obtained by combining a first parity check matrix for an LDPC code having a higher code rate than a reference value with a second parity check matrix for an LDPC code having a lower code rate than the reference value.

In an embodiment, the parity check matrix may include a zero matrix, an identity matrix, and a dual diagonal matrix.

In another embodiment, the encoded LDPC codeword may include a systematic part corresponding to the input information, a first parity part corresponding to the dual diagonal matrix, and a second parity part corresponding to the identity matrix.

In another embodiment, said encoding may comprise calculating the first parity part using the first parity check matrix and the input information and calculating the second parity part using the second parity check matrix based on the input information and the calculated first parity part.

In another embodiment, an element matrix of the dual diagonal matrix may constitute a dual diagonal line and is an identity matrix, and a remaining element matrix of the dual diagonal matrix may be a zero matrix.

In another embodiment, an element matrix of the dual diagonal matrix constituting a dual diagonal line may be continuous to an element matrix that constitutes a diagonal line of the identity matrix.

In another embodiment, the method may further comprise, before said encoding, determining a code rate of the LDPC code and determining a size of the dual diagonal matrix according to the determined code rate.

In another embodiment, the parity check matrix may include a zero matrix and a circulant permutation matrix.

According to another aspect of the present invention, an LDPC encoder comprises an input unit receiving information and an encoding unit encoding the input information with an LDPC codeword using a parity check matrix, wherein the parity check matrix may have a structure obtained by combining a first parity check matrix for an LDPC code having a higher code rate than a reference value with a second parity check matrix for an LDPC code having a lower code rate than the reference value.

According to still another aspect of the present invention, a method of decoding an LDPC code by an LDPC (Low Density Parity Check) decoder comprises receiving an LDPC codeword encoded by a parity check matrix and decoding the received LDPC codeword using the parity check matrix, wherein the parity check matrix may have a structure obtained by combining a first parity check matrix for an LDPC code having a higher code rate than a reference value with a second parity check matrix for an LDPC code having a lower code rate than the reference value.

According to yet still another aspect of the present invention, an LDPC decoder comprises a receiving unit receiving an LDPC (Low Density Parity Check) codeword encoded by a parity check matrix and a decoding unit decoding the received LDPC codeword using the parity check matrix, wherein the parity check matrix may have a structure obtained by combining a first parity check matrix for an LDPC code having a higher code rate than a reference value with a second parity check matrix for an LDPC code having a lower code rate than the reference value.

In a terrestrial cloud broadcast system, a LDPC (Low Density Parity Check) may be provided that operates in a negative SNR (Signal to Noise Ratio) environment.

This code provides better performance and lower complexity than those provided by the LDPC code used in the DVB-T2 (Digital Video Broadcasting-Terrestrial version 2) and DVB-S2 (Digital Video Broadcasting-Satellite-Second Generation) system.

BRIEF DESCRIPTION OF THE DRAWINGS

The embodiments of the present invention will become readily apparent by reference to the following detailed description when considered in conjunction with the accompanying drawings wherein.

DESCRIPTION OF THE EMBODIMENTS

Embodiments of the present invention will be described in detail with reference to the accompanying drawings to be worked on by those of ordinary skill in the art. However, the present invention may be embodied in various ways and is not limited thereto. What is irrelevant to the present invention has been omitted from the drawings, and similar denotations have been assigned to similar components throughout the specification.

As used herein, when an element "includes" or "comprises" another element, the element, unless stated otherwise, may further include or comprise the other element, but not excluding the other element. Further, as used herein, the term "unit" or "part" means a basis for processing at least one function or operation, which may be implemented in hardware or software or in a combination of software and hardware.

Figure 1:
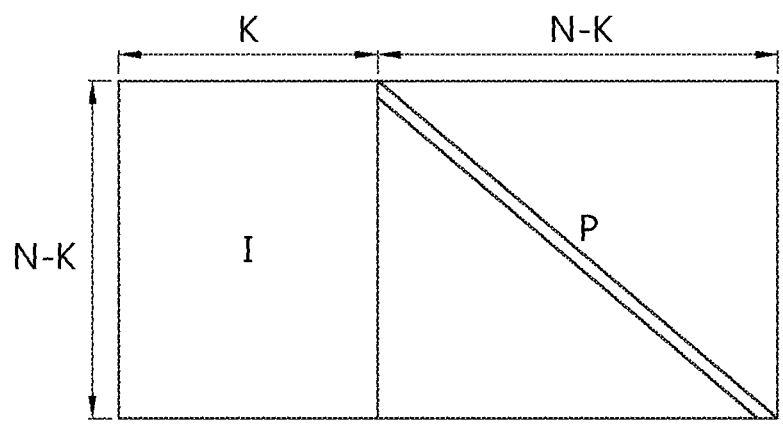
FIG. 1 is a view illustrating a PCM (Parity Check Matrix) structure of a QC-LDPC (Quasi-Cyclic Low Density Parity Check) code used in a DVB (Digital Video Broadcasting) system.

FIG. 1 is a view illustrating a PCM (Parity Check Matrix) structure of a QC-LDPC (Quasi-Cyclic Low Density Parity Check) code used in a DVB (Digital Video Broadcasting) system.

In general, the LDPC code is known as an error correction code that is closest to the Shannon limit in an AWGN (Additive White Gaussian Noise) channel and provides asymptotically better performance than that provided by the Turbo code while enabling parallelizable decoding.

Such an LDPC code is defined by a low-density PCM (Parity Check Matrix) that is randomly generated. However, the randomly generated LDPC code needs a lot of memory to store the PCM and requires a long time to access the memory.

To address such a problem with the memory, the QC-LDPC (Quasi-Cyclic LDPC) code has been suggested, and the QC-LDPC code constituted of Zero matrixes or CPMs (Circulant Permutation Matrixes) is defined by PCM(H) as shown in Equation 1:

$$H = \begin{bmatrix} P^{a_{11}} & P^{a_{12}} & \cdots & P^{a_{1n}} \\ P^{a_{21}} & P^{a_{22}} & \cdots & P^{a_{2n}} \\ \vdots & \vdots & \ddots & \vdots \\ P^{a_{m1}} & P^{a_{m2}} & \cdots & P^{a_{mn}} \end{bmatrix},$$ [Equation 1]

for $a_{ij} \in \{0, 1, \ldots, L-1, \infty\}$

Here, P is a CPM having a size of L×L and is defined as in Equation 2:

$$P_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix}.$$ [Equation 2]

Further, $P^i$ is a matrix obtained by right-shifting, i(0≤i<L) times, an identity matrix $$I \left( \stackrel{\Delta}{=} P^0 \right)$$

having a size of L×L, and $P^\infty$ is the zero matrix having a size of L×L. Accordingly, in the case of the QC-LDPC code, only exponent i may be stored in order to store $P^i$, and thus, the memory required for storing PCM is reduced to 1/L.

As an example, the QC-LDPC code used in the DVB system, as shown in FIG. 1, is constituted of I matrixes and P matrixes. The I matrix is a matrix having a size of (N−K)×K, and the P matrix is a dual diagonal matrix having a size of (N−K)×(N−K). Here, N is the length of codeword, and K is the length of input information.

Figure 2:
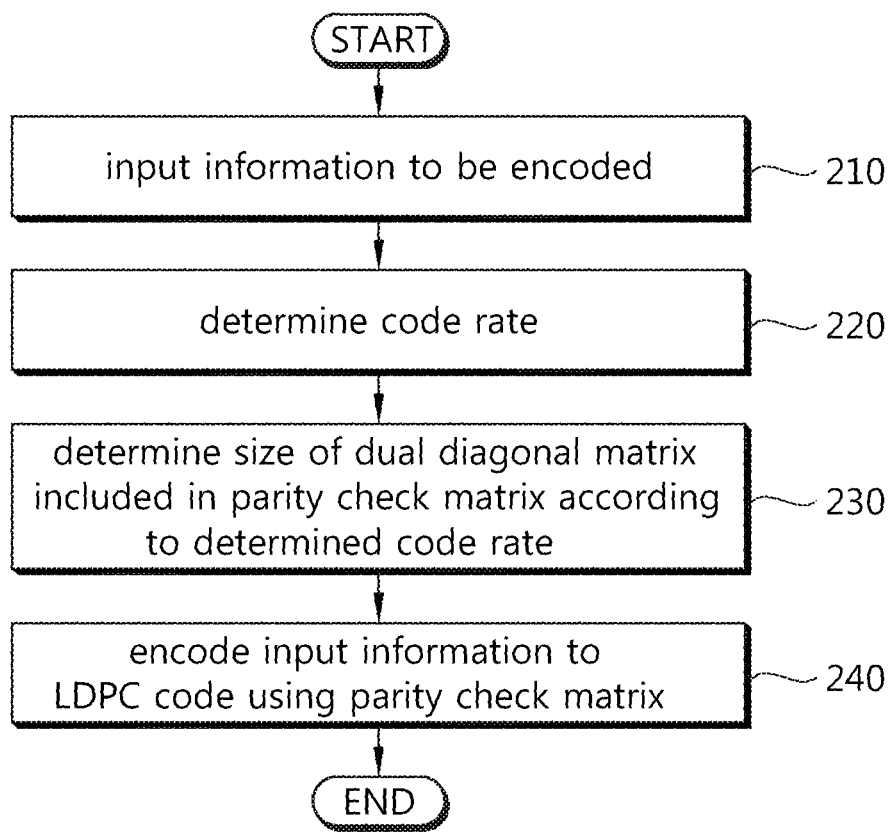
FIG. 2 is a flowchart illustrating a method of encoding input information with an LDPC code that operates in a negative SNR (Signal to Noise Ratio) environment according to an embodiment of the present invention.
Figure 3:
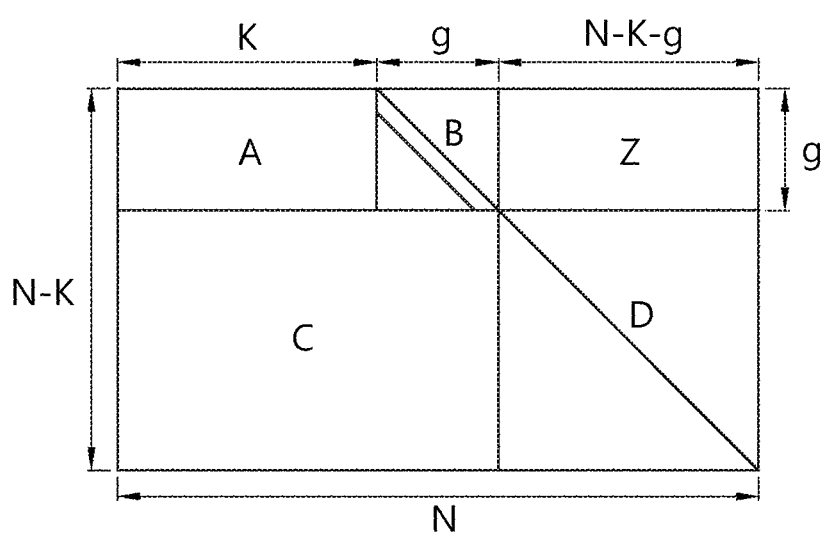
FIG. 3 is a view illustrating a PCM structure of an LDPC code according to an embodiment of the present invention.

FIG. 2 is a flowchart illustrating a method of encoding input information with an LDPC code that operates in a negative SNR (Signal to Noise Ratio) environment according to an embodiment of the present invention, and FIG. 3 is a view illustrating a PCM structure of an LDPC code according to an embodiment of the present invention.

Referring first to FIG. 2, the LDPC encoder according to the present invention, if information to be encoded is entered (210) and a code rate is determined (220), determines the size of a dual diagonal matrix that is variably included in the parity check matrix in accordance with the determined code rate (230). At this time, although in FIG. 2 the code rate is determined after the information to be encoded is entered, the code rate, as necessary, may be previously determined before the information is input or may be determined when the information is input.

Thereafter, the LDPC encoder, as shown in FIG. 3, may encode the input information with an LDPC codeword using a determined parity check matrix. Here, the parity check matrix may have a structure in which a first parity check matrix (PCM[A B]) for a LDPC code having a higher code rate a reference value (e.g., 0.5) and a second parity check matrix (PCM[C D]) for an LDPC code having a lower code rate lower than the reference value are combined with each other.

As an example, referring to FIG. 3, the parity check matrix according to the present invention may include a dual diagonal matrix B, an identity matrix D, and a zero matrix. Here, in the dual diagonal matrix B, an element matrix constituting the dual diagonal line may be an identity matrix, and the remaining element matrixes may be zero matrixes. The element matrix constituting the dual diagonal line of the dual diagonal matrix B may be continuous to the element matrix constituting the diagonal line of the identity matrix D.

In FIG. 3, N is the length of the codeword, K is the length of the information, and g is a value that varies depending on the code rate. Matrix A and matrix C have sizes of g×K and (N−K−g)×(K+g), respectively, and may be constituted of circulant permutation matrixes and zero matrixes having a size of L×L. Further, matrix Z is a zero matrix having a size of g×(N−K−g), and matrix B is a dual diagonal matrix having a size of g×g. Matrix B may be expressed as in Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \cdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix}$$

[Equation 3]

Here, is an element matrix and is an identity matrix having a size of L×L.

The LDPC codeword that is encoded through the parity check matrix as shown in FIG. 3 may include the systematic part of (N−K)×K corresponding to the input information, a first parity part corresponding to the dual diagonal matrix B, and a second parity part corresponding to the identity matrix D.

The LDPC encoder according to the present invention may calculate the first parity part using the input information and the first parity check matrix (PCM[A B]) and may calculate the second parity part using the second parity check matrix (PCM[C D]) based on the input information and the calculated first parity part.

Specifically, the LDPC encoder according to the present invention may encode input information using Equation 4 as follows:

$$Hc^T = 0$$

[Equation 4]

Here, H is the parity check matrix, and c is the LDPC codeword.

Meanwhile, Equation 4 may be split as shown in Equation 5:

$$As^T + B_{p_1}^{\ T} = 0$$

$$C(s,p_1)^T + D_{p_2}^{\ T} = 0$$

[Equation 5]

Here, s is the systematic part, $P_1$ is the first parity part, and $P_2$ is the second parity part.

Since B is a dual diagonal matrix, the encoding process for calculating the first parity part $P_1$ may be performed by an accumulator of a block type. Further, since D is an identity matrix, the second parity part $P_2$ may be simply calculated by $p_2^T = C(s, p_1)^T$. As such, the LDPC encoder according to the present invention has an efficient linear time encoding algorithm and thus its complexity is reduced.

As an example, N, K, and g of LDPC codes having a code rate 0.25, which have codeword lengths of 8192, 16384, 32768, and 65536, respectively, are given as in Table 1:

TABLE 1

| N | K | g |
|---|---|---|
| 8192 | 2048 | 160 |
| 16384 | 4096 | 320 |
| 32768 | 8192 | 640 |
| 65536 | 16384 | 1280 |

An exemplary method of expressing the PCM of the QC-LDPC code designed as in Table 1 is now described.

Assume that a QC-LDPC code having a code rate of 4/, N=28 and K=16, and that is constituted of a 4×4 CPM has a PCM as shown in Equation 6:

[Equation 6]

$$H = \begin{bmatrix} P^2 & P^3 & P^\infty & P^\infty & P^0 & P^\infty & P^\infty \\ P^\infty & P^1 & P^\infty & P^2 & P^\infty & P^0 & P^\infty \\ P^2 & P^3 & P^0 & P^\infty & P^\infty & P^\infty & P^0 \end{bmatrix}$$

$$= \begin{pmatrix} \begin{bmatrix} 0 & 0 & 1 & 0 & 0 & 0 & 0 & 1 & 0 & 0 & 0 & 0 & 0 & 0 & 0 & 0 & 1 & 0 & 0 & 0 & 0 & 0 & 0 & 0 & 0 & 0 & 0 \\ 0 & 0 & 0 & 1 & 1 & 0 & 0 & 0 & 0 & 0 & 0 & 0 & 0 & 0 & 0 & 0 & 0 & 1 & 0 & 0 & 0 & 0 & 0 & 0 & 0 & 0 & 0 \\ 1 & 0 & 0 & 0 & 0 & 1 & 0 & 0 & 0 & 0 & 0 & 0 & 0 & 0 & 0 & 0 & 0 & 0 & 1 & 0 & 0 & 0 & 0 & 0 & 0 & 0 & 0 \\ 0 & 1 & 0 & 0 & 0 & 0 & 1 & 0 & 0 & 0 & 0 & 0 & 0 & 0 & 0 & 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 & 0 & 1 & 0 & 0 & 0 & 0 & 0 & 1 & 0 & 0 & 0 & 0 & 0 & 0 & 0 \\ 0 & 0 & 0 & 0 & 0 & 0 & 1 & 0 & 0 & 0 & 0 & 0 & 0 & 0 & 1 & 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 1 & 0 & 0 & 0 & 0 & 0 & 0 & 0 & 0 & 0 & 1 & 0 & 0 & 0 & 0 & 0 \\ 0 & 0 & 0 & 0 & 1 & 0 & 0 & 0 & 0 & 0 & 0 & 0 & 1 & 0 & 0 & 0 & 0 & 0 & 0 & 0 & 0 & 0 & 1 & 0 & 0 & 0 & 0 \\ 0 & 0 & 1 & 0 & 0 & 0 & 0 & 1 & 1 & 0 & 0 & 0 & 0 & 0 & 0 & 0 & 0 & 0 & 0 & 0 & 0 & 0 & 0 & 1 & 0 & 0 & 0 \\ 0 & 0 & 0 & 1 & 1 & 0 & 0 & 0 & 0 & 1 & 0 & 0 & 0 & 0 & 0 & 0 & 0 & 0 & 0 & 0 & 0 & 0 & 0 & 0 & 1 & 0 & 0 \\ 1 & 0 & 0 & 0 & 0 & 1 & 0 & 0 & 0 & 0 & 1 & 0 & 0 & 0 & 0 & 0 & 0 & 0 & 0 & 0 & 0 & 0 & 0 & 0 & 0 & 1 & 0 \\ 0 & 1 & 0 & 0 & 0 & 0 & 1 & 0 & 0 & 0 & 1 & 0 & 0 & 0 & 0 & 0 & 0 & 0 & 0 & 0 & 0 & 0 & 0 & 0 & 0 & 0 & 1 \end{bmatrix} \\ P^0 = \begin{bmatrix} 1 & 0 & 0 & 0 \\ 0 & 1 & 0 & 0 \\ 0 & 0 & 1 & 0 \\ 0 & 0 & 0 & 1 \end{bmatrix}, \; P^1 = \begin{bmatrix} 0 & 1 & 0 & 0 \\ 0 & 0 & 1 & 0 \\ 0 & 0 & 0 & 1 \\ 1 & 0 & 0 & 0 \end{bmatrix}, \; P^2 = \begin{bmatrix} 0 & 0 & 1 & 0 \\ 0 & 0 & 0 & 1 \\ 1 & 0 & 0 & 0 \\ 0 & 1 & 0 & 0 \end{bmatrix}, \; P^3 = \begin{bmatrix} 0 & 0 & 0 & 1 \\ 1 & 0 & 0 & 0 \\ 0 & 1 & 0 & 0 \\ 0 & 0 & 1 & 0 \end{bmatrix}, \; P^\infty = \begin{bmatrix} 0 & 0 & 0 & 0 \\ 0 & 0 & 0 & 0 \\ 0 & 0 & 0 & 0 \\ 0 & 0 & 0 & 0 \end{bmatrix} \end{pmatrix}$$

The PCM may be represented as follows.

| | |
|---|---|
| 7 3 | Matrix size (# of columns = 7, # of rows = 3) |
| 2 3 1 1 1 1 1 | Column weight distribution |
| | $0^{th}$ column weight = 2, $1^{st}$ column weight = 3, |
| | $2^{nd}$ column weight = 1, $3^{rd}$ column weight = 1, |
| | $4^{th}$ column weight = 1, $5^{th}$ column weight = 1, |
| | $6^{th}$ column weight = 1. |
| 3 3 4 | Row weight distribution |
| | $0^{th}$ row weight = 3, $1^{st}$ row weight = 3, |
| | $2^{nd}$ row weight = 4. |
| | Location of non-zero matrix at each row |
| 0 1 4 | Non-zero matrix location of $0^{th}$ row, row weight = 3 |
| 1 3 5 | Non-zero matrix location of $1^{st}$ row, row weight = 3 |
| 0 1 2 6 | Non-zero matrix location of $2^{nd}$ row, row weight = 4 |
| | Exponent value of non-zero matrix at each row |
| 2 3 0 | Exponent value of non-zero matrix of $0^{th}$ row |
| 1 2 0 | Exponent value of non-zero matrix of $1^{st}$ row |
| 2 3 0 0 | Exponent value of non-zero matrix of $2^{nd}$ row |

The PCM of the QC-LDPC code with a code rate of 0.25, which operates in a negative SNR environment for a terrestrial cloud broadcast system according to the present invention may be represented in such way, thus resulting in the embodiments in the PA1264-3C_Table.txt file.

FIGS. 4 to 8 show examples of the PCM structure of the LDPC code according to embodiments of the present invention.

Figure 4:
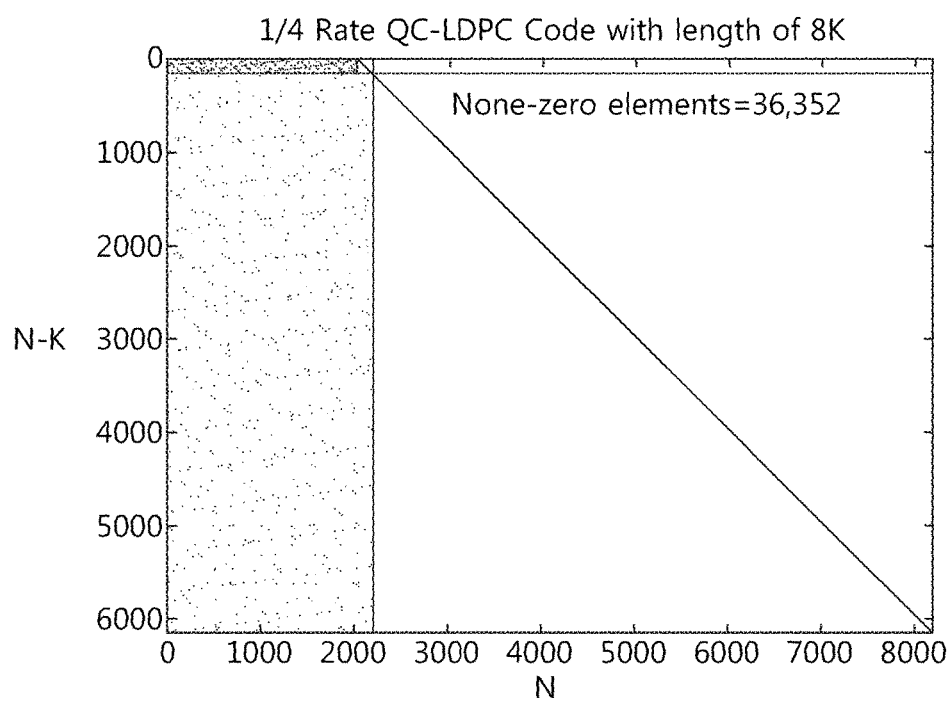
FIG. 4 is a view illustrating the PCM structure of a QC-LDPC code for terrestrial cloud broadcast, wherein the length of the codeword is 8192.
Figure 5:
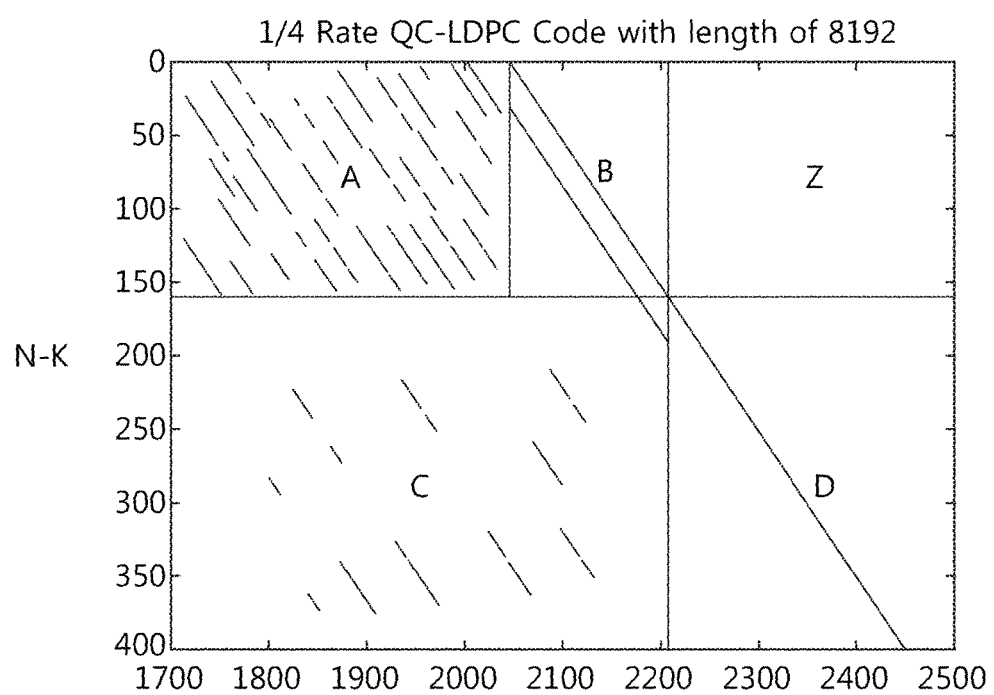
FIG. 5 is an expanded view of the PCM structure shown in FIG. 4.

As an example, FIG. 4 illustrates the PCM structure of a QC-LDPC code for terrestrial cloud broadcast, wherein the length of the codeword is 8192, and FIG. 5 is an expanded view of the PCM structure shown in FIG. 4.

Figure 6:
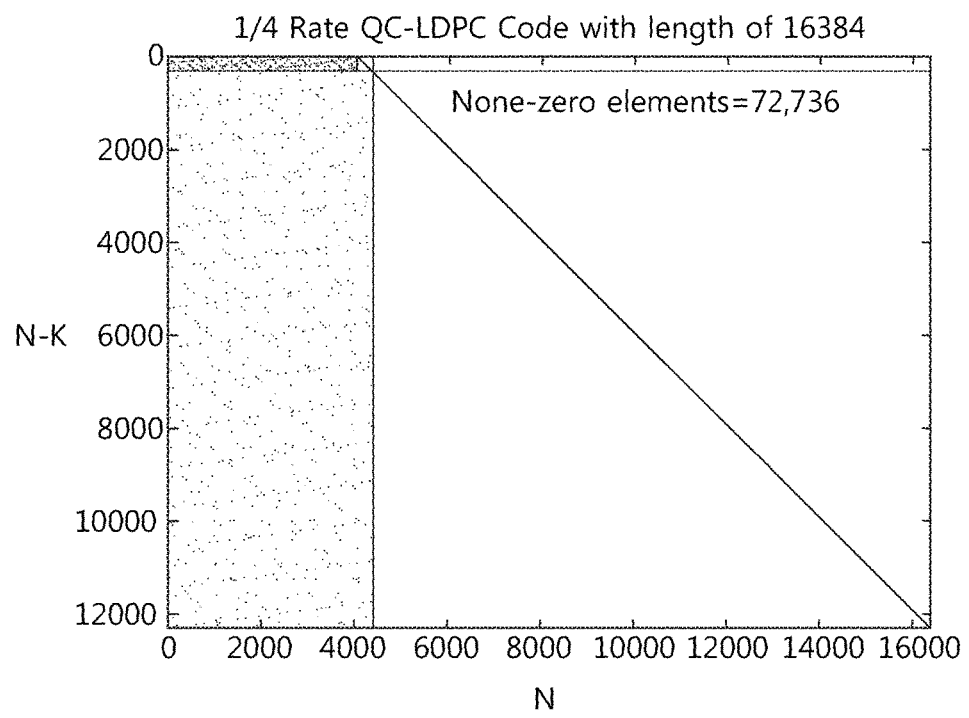
FIG. 6 is a view illustrating the PCM structure of a QC-LDPC code for terrestrial cloud broadcast, wherein the length of the codeword is 16384.
Figure 7:
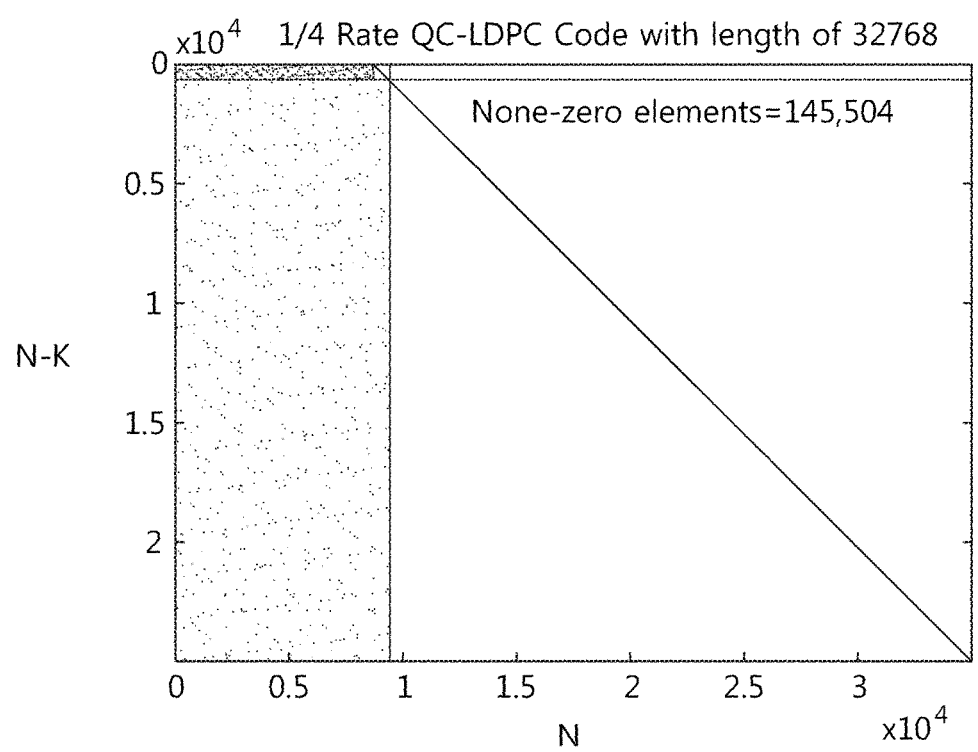
FIG. 7 is a view illustrating the PCM structure of a QC-LDPC code for terrestrial cloud broadcast, wherein the length of the codeword is 32768.
Figure 8:
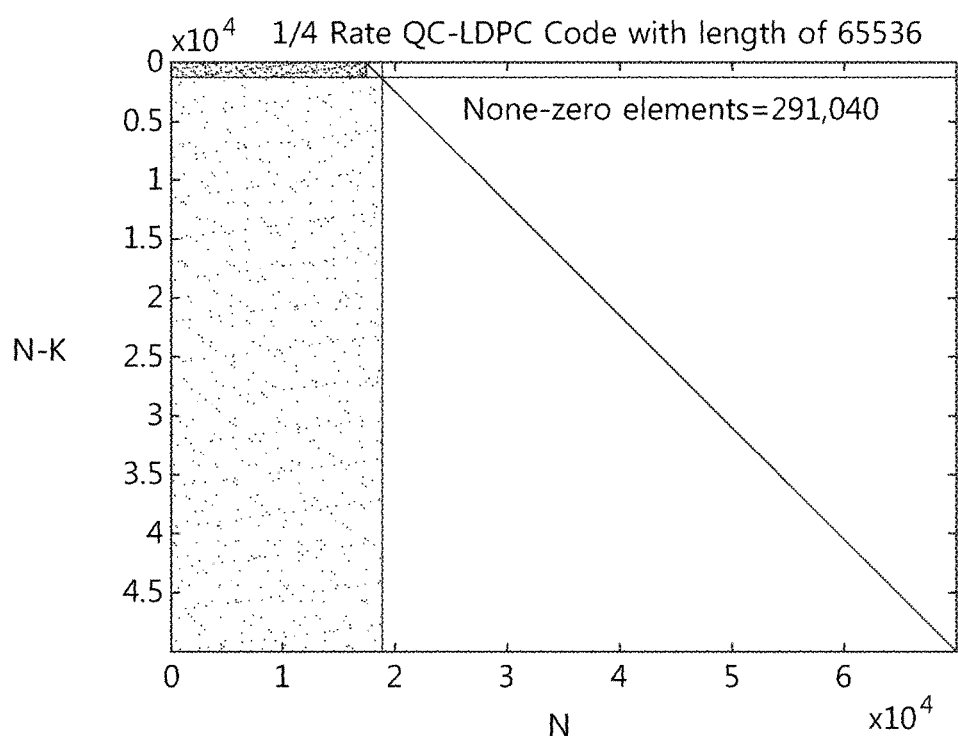
FIG. 8 is a view illustrating the PCM structure of a QC-LDPC code for terrestrial cloud broadcast, wherein the length of the codeword is 65536.

Meanwhile, FIG. 6 illustrates the PCM structure of a QC-LDPC code for terrestrial cloud broadcast, wherein the length of the codeword is 16384, FIG. 7 illustrates the PCM structure of a QC-LDPC code for terrestrial cloud broadcast, wherein the length of the codeword is 32768, and FIG. 8 illustrates the PCM structure of a QC-LDPC code for terrestrial cloud broadcast, wherein the length of the codeword is 65536.

Figure 9:
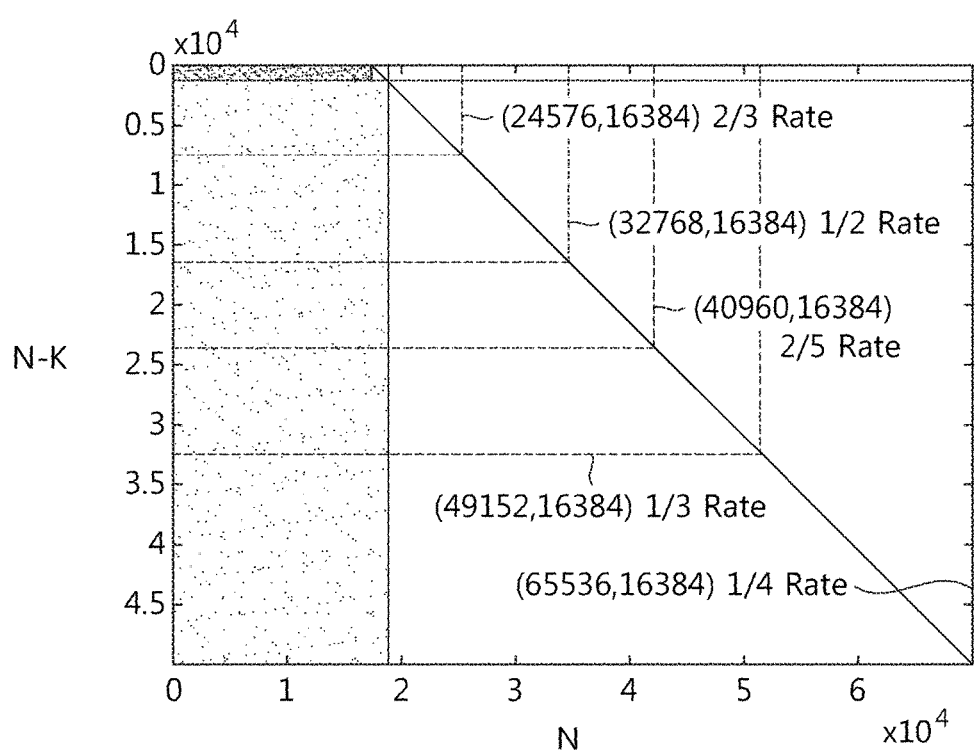
FIG. 9 illustrates an example of the PCM structure of an LDPC code according to code rates according to an embodiment of the present invention.

FIG. 9 illustrates an example of the PCM structure of an LDPC code according to code rates according to an embodiment of the present invention.

The PCM of the LDPC code according to the present invention consists of multiple single parity check codes, and thus, it may be truncated for each of the different code rates, as shown in FIG. 9. For example, LDPC codes having code rates of 1/2 and 1/3 may be easily generated by truncating the PCM by 50 and 83.3%. This means that only part of the overall codeword may be decoded in a high SNR region by the LDPC code according to the present invention. Accordingly, the LDPC decoder may save power consumption and reduce waiting time.

Figure 10:
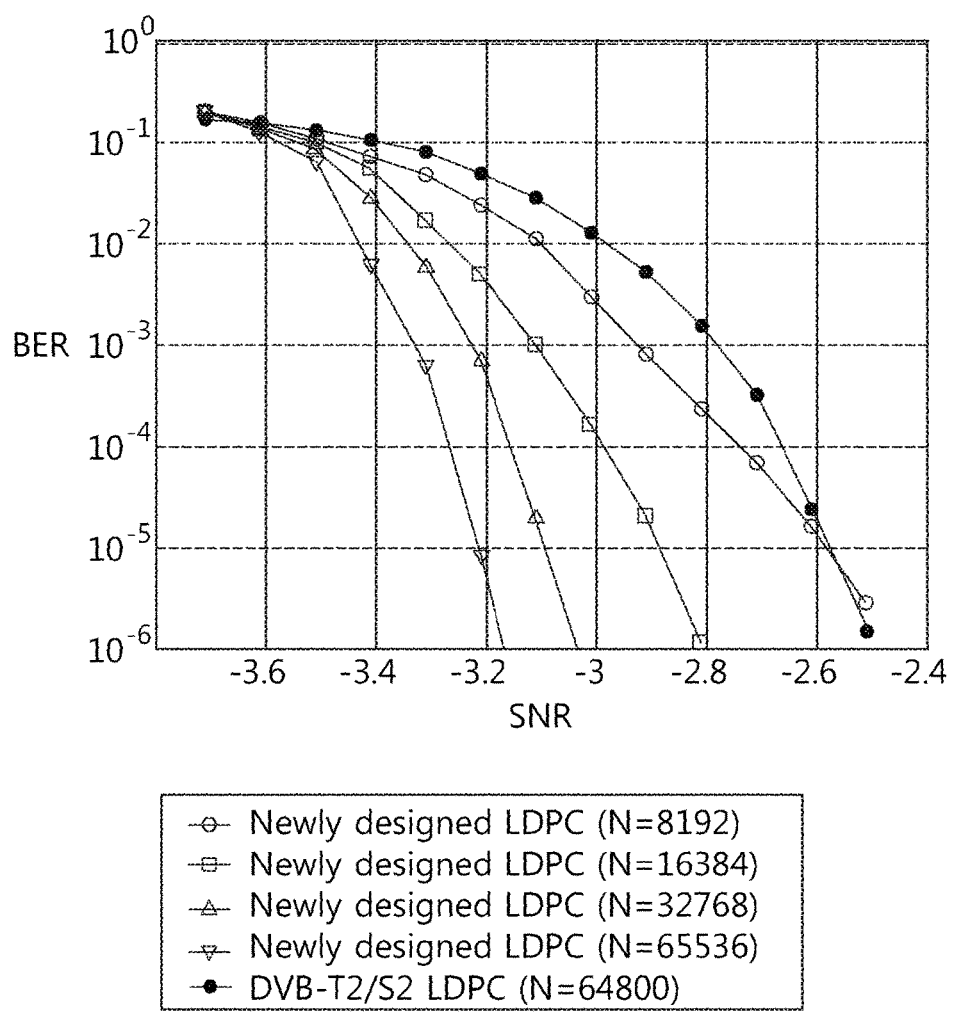
FIG. 10 is a graph illustrating the performance of LDPC codes according to an embodiment of the present invention.

FIG. 10 is a graph illustrating the performance of LDPC codes according to an embodiment of the present invention.

As an example, in FIG. 10, the performance of the QC-LDPC code having a code rate of 0.25 is shown as compared with the SNR. For purposes of computational experiment, an LLR (Log-likelihood Ratio)-based sum-product algorithm has been assumed that performs QPSK (Quadratic Phase Shift Keying) modulation and 50 counts of repeated decoding.

Meanwhile, FIG. 10 also illustrates the LDPC codes used in the DVB-T2/S2 system, which have a code rate of 0.25 and a codeword length of 64800, to show the excellent performance of the LDPC codes newly designed according to the present invention. Further, Table 2 below shows the performance gap that stems from the Shannon limit of the LDPC code designed for terrestrial cloud broadcast at BER (Bit Error Probability)=$2 \times 10^{-6}$ and Table 3 shows the complexity of the LDPC code that is proportional to the number of 1's in the PCM.

TABLE 2

| Length (N) | Shannon Limit [SNR, dB] | Gap from Limit [dB] |
|---|---|---|
| 8192 | −3.804 | 1.29 |
| 16384 | −3.804 | 0.99 |
| 32768 | −3.804 | 0.79 |
| 65536 | −3.804 | 0.6 |
| DVB (64800) | −3.804 | 1.29 |

TABLE 3

| Length (N) | Number of ones in PCM |
|---|---|
| 8192 | 36,352 |
| 16384 | 72,736 |

TABLE 3-continued

| Length (N) | Number of ones in PCM |
|---|---|
| 32768 | 145,504 |
| 65536 | 291,040 |
| DVB (64800) | 194,399 |

Referring to FIG. 10 and Tables 2 and 3, among the LDPC codes newly designed according to the present invention, the LDPC code having a codeword length of 65536 is about 0.69 dB better in performance but about 50% higher in complexity than the LDPC code of the DVB-T2/S2 system, which has a codeword length of 64800. However, the LDPC codes having the codeword lengths of 16384 and 32768 are respectively more excellent in performance by about 0.3 dB and about 0.5 dB and lower in complexity by about 63% and about 25% than the LDPC code of the DVB-T2/S2 system which has a codeword length of 64800. Further, the LDPC codes newly designed according to the present invention, when their codeword lengths are 8192, 16384, 32768, and 65536, are spaced apart from the Shannon limit by about 1.29 dB, about 0.99 dB, about 0.79 dB, and about 0.6 dB at BER=$2\times10^{-6}$.

Figure 11:
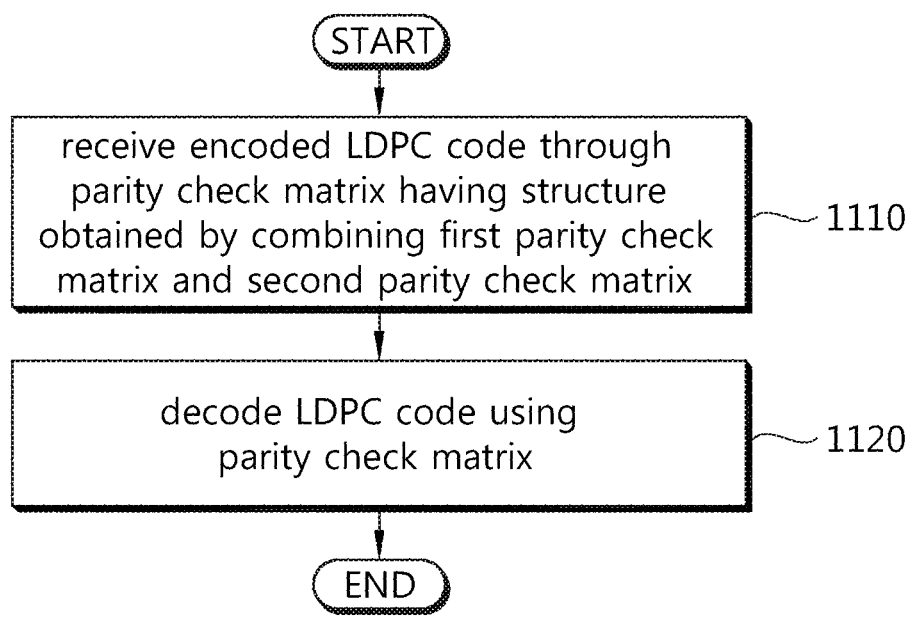
FIG. 11 is a flowchart illustrating a method of decoding an LDPC codeword according to an embodiment of the present invention.

FIG. 11 is a flowchart illustrating a method of decoding an LDPC codeword according to an embodiment of the present invention.

Referring to FIG. 11, the LDPC decoder according to the present invention, when receiving an LDPC codeword (1110), decodes the received LDPC codeword using a parity check matrix obtained by combining a first parity check matrix for an LDPC code having a higher code rate than a reference value (e.g., 0.5) with a second parity check matrix for an LDPC code having a lower code word than the reference value (1120). At this time, the parity check matrix, as shown in FIG. 3, may include the zero matrix Z, the identity matrix D, and the dual diagonal matrix B. In the dual diagonal matrix B, the element matrix constituting the dual diagonal line is an identity matrix, and the remaining element matrixes may be zero matrixes. The element matrix constituting the dual diagonal line of the diagonal matrix B may be continuous to the element matrix constituting the diagonal line of the identity matrix D.

Figure 12:
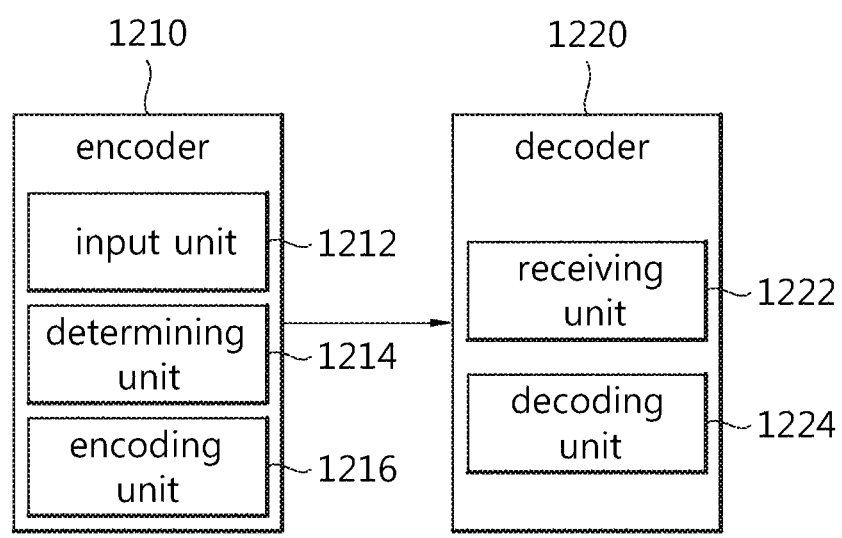
FIG. 12 is a block diagram illustrating an LDPC encoder and an LDPC decoder according to an embodiment of the present invention.

FIG. 12 is a block diagram illustrating an LDPC encoder and an LDPC decoder according to an embodiment of the present invention.

Referring to FIG. 12, the LDPC encoder 1210 according to the present invention may include, as an example, an input unit 1212, a determining unit 1214, and an encoding unit 1216. The LDPC decoder 1220 may include a receiving unit 1222 and a decoding unit 1224.

The input unit 1212 receives information to be encoded.

The determining unit 1214 determines a code rate of the LDPC code and determines the size of a dual, diagonal matrix depending on the determined code rate.

The encoding unit 1216 encodes the information input through the input unit 1212 with the LDPC codeword by using the parity check matrix having the code rate determined by the determining unit 1214. Here, the parity check matrix may consist of zero matrixes and circulant permutation matrixes.

Meanwhile, the parity check matrix, as an example, may have the structure in which a first parity check matrix for an LDPC code having a higher code rate than a reference value and a second parity check matrix for an LDPC code having a lower code rate than the reference value. Here, the reference value may be, e.g., 0.5. It may include a zero matrix, an identity matrix, and a dual diagonal matrix. Specifically, the parity check matrix may have a structure as shown in FIG. 3, and in such case, the first parity check matrix may include the dual diagonal matrix B, and the second parity check matrix may include the identity matrix D. In the dual diagonal matrix B, the element matrix constituting the dual diagonal line may be an identity matrix while the remaining element matrixes may be zero matrixes. The element matrix constituting the dual diagonal line may be continuous to the element matrix constituting the diagonal line of the identity matrix D.

The encoding unit 1216, as an example, may encode the input information with the LDPC codeword by calculating the first parity part using the information input through the input unit 1212 and the first parity check matrix and by calculating the second parity part using the second parity check matrix based on the input information and the calculated first parity part.

The LDPC codeword encoded by the encoding unit 1216 may include the systematic part corresponding to the information input through the input unit 1212, the first parity part corresponding to the dual diagonal matrix, and the second parity part corresponding to the identity matrix.

Meanwhile, the receiving unit 1222 of the decoder 1220 receives the LDPC codeword encoded by the parity check matrix. The LDPC codeword received by the receiving unit 1222 may include the systematic part, the first parity part, and the second parity part.

The decoding unit 1224, as shown in FIG. 3, decodes the LDPC codeword received by the receiving unit 1222 using the parity check matrix as shown in FIG. 3.

Although exemplary embodiments of the present invention have been described, the present invention is not limited thereto, and various modifications or variations may be made thereto without departing from the scope of the present invention. The embodiments described herein are not provided to limit the present invention but to describe the invention, and the present invention is not limited thereto. The scope of the present invention should be interpreted within the appended claims and the spirit within the equivalents of the invention should be construed to be included in the scope of the invention.

What is claimed is:

1. A method of decoding an LDPC (Low Density Parity Check) code by an LDPC decoder, the method comprising:
    receiving a transmitted signal corresponding to an LDPC codeword from a transmitting device through a broadcast channel, the LDPC codeword including parity bits for correcting errors over the broadcast channel; and
    decoding a received signal corresponding to LDPC codeword, the LDPC codeword corresponding to a parity check matrix, wherein the parity check matrix includes a dual diagonal matrix and an identity matrix,
    wherein the parity bits comprise only two parity parts of a first parity part corresponding to the dual diagonal matrix and a second parity part corresponding to the identity matrix,
    wherein the LDPC codeword is generated by performing:
        obtaining the first parity part using accumulating corresponding to the dual diagonal matrix based on input information, and
        obtaininq the second parity part corresponding to the identity matrix based on the calculated first parity part.

2. The method of claim 1, wherein the LDPC codeword is generated by further performing puncturing the LDPC codeword corresponding to predetermined locations of at least one of the first parity part and the second parity part for a target code rate.

3. The method of claim 2, wherein the puncturing corresponds to the identity matrix in the parity check matrix.

4. An LDPC (Low Density Parity Check) decoder comprising:
- a receiving unit configured to receive a transmitted signal corresponding to an LDPC codeword from a transmitting device through a broadcast channel, the LDPC codeword including parity bits for correcting errors over the broadcast channel; and
- a decoding unit configured to decode a received signal corresponding to the LDPC codeword, the LDPC codeword corresponding to a parity check matrix, wherein the parity check matrix includes a dual diagonal matrix and an identity matrix, wherein the parity bits comprise only two parity parts of a first parity part corresponding to the dual diagonal matrix and a second parity part corresponding to the identity matrix, wherein the LDPC codeword is generated by performing:
- obtaining the first parity part using accumulation corresponding to the dual diagonal matrix based on the input information; and
- obtaining the second parity part corresponding to the identity matrix based on the calculated first parity part.

5. The LDPC decoder of claim 4, wherein the LDPC codeword is generated by further performing
puncturing the LDPC codeword corresponding to predetermined locations of at least one of the first parity part and the second parity part for a target code rate.

6. The LDPC decoder of claim 5, wherein the puncturing corresponds to the identity matrix in the parity check matrix.

* * * * *